United States Patent [19]

Jayadev et al.

[11] 4,447,277
[45] May 8, 1984

[54] MULTIPHASE THERMOELECTRIC ALLOYS AND METHOD OF MAKING SAME

[75] Inventors: Tumkur S. Jayadev, Rochester; On V. Nugyen, Sterling Heights, both of Mich.

[73] Assignee: Energy Conversion Devices, Inc., Troy, Mich.

[21] Appl. No.: 412,306

[22] Filed: Aug. 27, 1982

Related U.S. Application Data

[63] Continuation-in-part of Ser. No. 341,864, Jan. 22, 1982, abandoned.

[51] Int. Cl.$^3$ ............................................ C22C 28/00
[52] U.S. Cl. .............................. 148/400; 148/11.5 R; 148/13.1; 420/579; 420/580; 252/62.3 T
[58] Field of Search ............... 420/579, 501, 571, 547, 420/580; 252/623 T; 148/400, 4, 11.5, 13.1

[56] References Cited

U.S. PATENT DOCUMENTS

| | | | |
|---|---|---|---|
| 2,957,937 | 10/1960 | Jensen et al. | 252/62.3 T |
| 2,995,613 | 8/1961 | Wernick | 252/62.3 T |
| 3,020,326 | 2/1962 | Fredrick | 252/62.3 T |
| 3,228,805 | 1/1966 | Waseleski et al. | 148/400 X |
| 3,256,699 | 6/1966 | Henderson | 252/62.3 T |
| 3,310,493 | 3/1967 | Rupprecht | 252/62.3 T |
| 3,414,405 | 12/1968 | Fisher | 148/400 X |

OTHER PUBLICATIONS

RCA Abstract Quarterly Report No. 6, May 1, 1960—Jul. 31, 1960, p. IV.

Primary Examiner—Brian E. Hearn
Assistant Examiner—David A. Hey
Attorney, Agent, or Firm—Lawrence G. Norris

[57] ABSTRACT

There is disclosed new and improved multiphase thermoelectric alloys and a method for making the same. The alloys are disordered materials having a multiplicity of matrix crystallites separated by generally disordered grain boundaries containing transitional phases and grain boundary regions of various phases including electrically conductive phases having at least one phase having high electrical conductivity.

The alloys are formed from a mixture of at least two separately prepared multiple element compounds preferably a first compound $Bi_{10}Sb_{30}Te_{60}$ or $Bi_{40}Te_{48}Se_{12}$ and a second compound $Ag_{25}Sb_{25}Te_{50}$. These compounds while crystalline, have different crystalline structures. They themselves are polycrystalline and do not represent the most stable crystalline structure. The first compound has a rhombohedral crystalline structure and the second compound has a face centered cubic crystalline structure. The compounds are combined in solid particulate form in proportions of 97 to 99.25 percent $Bi_{10}Sb_{30}Te_{60}$ and 3 to 0.25 percent $Ag_{25}Sb_{25}Te_{50}$ or 99 percent $Bi_{40}Te_{48}Se_{12}$ to 1 percent $Ag_{25}Sb_{25}Te_{50}$. The mixture is then heated in a quartz tube to an elevated temperature and then drawn through a temperature gradient for cooling.

The alloys include in the grain boundary regions various phases of silver and tellurium. The silver containing phases establish low resistance current paths through the crystallites to provide the alloy with high electrical conductivity. The disorder of the grain boundaries and the non-highly electrical conductive phases of the grain boundary regions provide low thermal conductivity desired for thermoelectric applications.

Also disclosed are alloys doped with a dopant such as tellurium iodide to form thermoelectric alloys having maximized $S^2\sigma$ products.

119 Claims, 9 Drawing Figures

MULTIPHASE THERMOELECTRIC ALLOYS AND METHOD OF MAKING SAME

RELATED APPLICATION

This is a continuation in part of copending application Ser. No. 341,864 filed Jan. 22, 1982 now abandoned in the names of Tumkur S. Jayadev and On Van Nguyen for New Multiphase Thermoelectric Alloys And Method Of Making Same.

BACKGROUND

The present invention relates to new and improved materials for thermoelectric applications and a method for making the same.

It has been recognized that the world supply of fossil fuels for the production of energy is being exhausted at ever increasing rates. This realization has resulted in an energy crisis which impacts not only the world's economy, but threatens the peace and stability of the world. The solution to the energy crisis lies in the development of new fuels and more efficient techniques to utilize them. To that end, the present invention deals with energy conservation, power generation, pollution, and the generation of new business opportunities by the development of new materials for use in devices which provide more electricity.

An important part of the solution with respect to the development of permanent, economical energy conversion lies in the field of thermoelectrics wherein electrical power is generated by heat. It has been estimated that two-thirds of all our energy, for example, from automobile exhausts or power plants, is wasted and given off to the environment. Up until now, there has been no serious climatic effect from this thermal pollution. However, it has been predicted that as the world's energy consumption increases, the effects of thermal pollution will ultimately lead to a partial melting of the polar ice caps with an attendant increase in sea level. Employment of the waste heat for the regeneration of electricity can provide a direct reduction in the thermal pollution, independent of the source of the energy.

The performance of a thermoelectric device can be expressed in terms of a figure of merit (Z) for the material forming the device, wherein Z is defined as:

$$Z = S^2 \sigma / K$$

where:

Z is expressed in units $\times 10^3$
S is the Seebeck coefficient in $\mu v/°C$.
K is the thermal conductivity in $mW/cm-°K$.
$\sigma$ is the electrical conductivity in $(\Omega-cm)^{-1}$ From the above, one can see that in order for a material to be suitable for thermoelectric power conversion, it must have a large value for the thermoelectric power Seebeck coefficient (S), a high electrical conductivity ($\sigma$), and a low thermal conductivity (K). Further, there are two components to the thermal conductivity (K): $K_l$, the lattice component; and $K_e$, the electrical component. In non-metals, $K_l$ dominates and it is this component which mainly determines the value of K.

Stated in another way, in order for a material to be efficient for thermoelectric power conversion, it is important to allow carriers to diffuse easily from the hot junction to the cold junction while maintaining the temperature gradient. Hence, high electrical conductivity is required along with low thermal conductivity.

Thermoelectric power conversion has not found wide usage in the past. The major reason for this is that prior art thermoelectric materials which are at all suitable for commercial applications have been crystalline in structure. Those crystalline materials best suited for thermoelectric devices are very difficult to manufacture because of poor mechanical properties and sensitivity of material properties to compositional changes. This results because they contain a predominance of elements, such as tellurium, and selenium which are natural glass formers. The growth, control, and mechanical stability of these crystals have, therefore, led to what to this date are insurmountable problems. In particular, the materials having a high figure of merit (Z) are generally made from chalcogenides such as tellurium compounds which are notorious for the difficulties in growth of high-quality single crystals. Even when such crystals are grown, they contain large densities of defects and are often unstable. In addition, they usually are far from stoichiometric. For all of these reasons, controlled doping has proven to be extremely difficult.

Crystalline solids cannot attain large values of electrical conductivity while maintaining low thermal conductivity. Most importantly, because of crystalline symmetry, thermal conductivity cannot be controlled by modification.

In the case of the conventional polycrystalline approach, the problems of single crystalline materials still dominate. However, new problems are also encountered by virtue of the polycrystalline grain boundaries which cause these materials to have relatively low electrical conductivities. In addition, the fabrication of these materials is also difficult to control as a result of their more complex crystalline structure. The chemical modification or doping of these materials, because of the above problems are especially difficult.

Among the best known currently existing polycrystalline thermoelectric materials are $(Bi, Sb)_2Te_3$, $PbTe$, and Si-Ge. The $(Bi, Sb)_2Te_3$ represents a continuous solid solution system in which the relative amounts of Bi and Sb are 0 to 100%. The Si-Ge materials are best suited for high temperature applications in the 600° to 1000° C. range with a satisfactory Z appearing at above 700° C. The PbTe polycrystalline material exhibits its best figure of merit in the 300° to 500° C. range. None of these materials is well suited for applications in the 100° C. to 300° C. range. This is indeed unfortunate, because it is in this temperature range where a wide variety of waste heat applications are found. Among such applications are geothermal waste heat and waste heat from internal combustion or diesel engines in, for example, trucks, buses, and automobiles. Applications of this kind are important because the heat is truly waste heat. Heat in the higher temperature ranges must be intentionally generated with other fuels and therefore is not truly waste heat.

The thermoelectric materials of the present invention are not single phase crystalline materials, but instead, are disordered materials. These materials are multiphase materials having both amorphous and multiple crystalline phases. Materials of this type are good thermal insulators. They include grain boundaries of various transitional phases varying in composition from the composition of matrix crystallites to the composition of the various phases in the grain boundary regions. The grain boundaries are highly disordered with the transitional phases including phases of high thermal resistivity to provide high resistance to thermal conduction.

Contrary to conventional materials the material is designed such that the grain boundaries define regions including conductive phases therein providing numerous electrical conduction paths through the bulk material for increasing electrical conductivity without substantially effecting the thermal conductivity. In essence, the materials of the present invention have all of the advantages of polycrystalline materials in desirably low thermal conductivities and crystalline bulk Seebeck properties. However, unlike the prior art polycrystalline materials, the disordered multiphase materials of the present invention also have desirably high electrical conductivities. Hence, in accordance with the present invention, the $S^2\sigma$ product for the figure of merit can be independently maximized with desirably low thermal conductivities for thermoelectric power generation.

Amorphous materials, representing the highest degree of disorder, have been made for thermoelectric applications. The materials and methods for making the same are fully disclosed and claimed, for example, in U.S. Pat. Nos. 4,177,473, 4,177,474 and 4,178,415 which issued in the name of Stanford R. Ovshinsky. The materials disclosed in these patents are formed in a solid amorphous host matrix having structural configurations which have local rather than long-range order and electronic configurations which have an energy gap and an electrical activation energy. Added to the amorphous host matrix is a modifier material having orbitals which interact with the amorphous host matrix as well as themselves to form electronic states in the energy gap. This interaction substantially modifies the electronic configurations of the amorphous host matrix to substantially reduce the activation energy and hence, increase substantially the electrical conductivity of the material. The resulting electrical conductivity can be controlled by the amount of modifier material added to the host matrix. The amorphous host matrix is normally of intrinsic-like conduction and the modified material changes the same to extrinsic-like conduction.

As also disclosed therein, the amorphous host matrix can have lone-pairs having orbitals wherein the orbitals of the modifier material interact therewith to form the new electronic states in the energy gap. In another form, the host matrix can have primarily tetrahedral bonding wherein the modifier material is added primarily in a non-substitutional manner with its orbitals interacting with the host matrix. Both d and f band materials as well as boron and carbon, which add multiorbital possibilities can be used as modifiers to form the new electronic states in the energy gap.

As a result of the foregoing, these amorphous thermoelectric materials have substantially increased electrical conductivity. However, because they remain amorphous after modification, they retain their low thermal conductivities making them well suited for thermoelectric applications, especially in high temperature ranges above 400° C.

These materials are modified on an atomic or microscopic level with the atomic configurations thereof substantially changed to provide the heretofor mentioned independently increased electrical conductivities. In contrast, the materials of the present invention are not atomically modified. Rather, they are fabricated in a manner which introduces disorder into the material on a macroscopic level. This disorder allows various phases including conductive phases to be introduced into the material much in the same manner as modification atomically in pure amorphous phase materials to provide controlled high electrical conductivity while the disorder in the other phases provides low thermal conductivity. These materials therefore are intermediate in terms of their thermal conductivity between amorphous and regular polycrystalline materials.

SUMMARY OF THE INVENTION

The present invention provides new and improved materials for thermoelectric applications in desired temperature ranges which have good Seebeck coefficients, high electrical conductivity, and low thermal conductivity and a method for making the same. The new and improved materials also have compositional disorder, translational disorder, configurational disorder, and other disorders introduced therein, albeit in a macroscopic manner, to more closely resemble the atomic, microscopic approach of truly amorphous materials to result in low thermal conductivities while allowing the incorporation of highly conductive phases to provide high electrical conductivities. The materials are multiphase alloy materials having a first phase including matrix crystallites bounded by disordered grain boundaries of various phases including transitional phases. Between the grain boundaries are macroscopic grain boundary regions which also include various phases including electrically conductive phases and crystalline inclusions. The grain boundary regions are rich in electrically conducting modifying phases which provide the high electrical conductivities. The other phases in the grain boundary regions and the grain boundaries provide the low thermal conductivities.

The materials are made in accordance with the method of the present invention by forming a mixture of at least first and second multiple element inorganic compounds. Generally, at least one of the compounds includes at least one element having high electrical conductivity, of at least $10^3$, exemplified by, for example, $10^4(\Omega-cm)^{-1}$. The mixture is heated to an elevated temperature and thereafter cooled to form a multiplicity of matrix crystallites separated by disordered grain boundaries defining grain boundary regions which contain the highly conductive phases therein.

The first and second compounds may be crystalline in structure but having different crystalline geometries. For example, prior to their being combined, the first compound can include bismuth, antimony, and tellurium having a rhombohedral crystalline structure and the second compound can include silver, antimony, and tellurium having a face centered cubic crystalline structure. Alternatively, the first compound can include bismuth, tellurium, and selenium.

The material can also include a dopant by adding tellurium iodine or cadmium chloride, for example, to one of the compounds prior to mixing.

DETAILED DESCRIPTION

Figure 1:
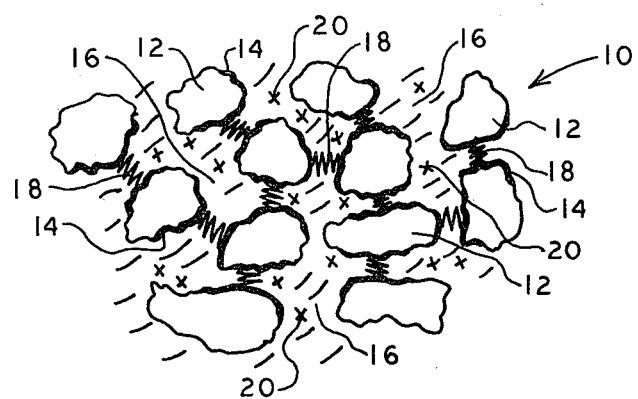
FIG. 1 is a fragmental cross-sectional view illustrating the structure of a material made in accordance with the method of the present invention.

The present invention provides a method of making thermoelectric materials of greatly improved figures of merit (Z) over desired temperature ranges by introducing the presence of disorder throughout the bulk of the material. The materials of the present invention have disorder not present in uniform crystalline structures. The disorder is not only in how the elements combine in their different phases in an atomic manner, but also in a macroscopic form wherein the materials have compositional disorder, translational disorder, configurational disorder or other disorders such as surface disorders as well as transitional phases on their surfaces between the phases which allow the creation of unique electrical conduction paths throughout the bulk of the material providing increased electrical conductivity while the disorder provides low thermal conductivity. The materials of the present invention have three dimensional disorder having a multiplicity of matrix crystallites separated by multiphase grain boundary regions and disordered grain boundaries. The grain boundary regions include highly electrically conductive modifying phases creating numerous interstitial conduction paths between crystallites throughout the bulk material affording control of the paths and thus the electrical conductivity whereas typical crystalline structures have overall bulk conductivity properties not easily changed.

Disorder in thermoelectric materials can be of varying degrees. Single phase crystalline materials, of course, can afford little disorder and therefore have substantially fixed parameters. Pure amorphous materials have no long range order at all and can be modified in a manner as previously described. The materials of the present invention are multiphase in structure having substantially more disorder than the crystalline materials of the prior art and have varying degrees of order and disorder inherent in them. The disorder may be the result of compositional disorder wherein a structure becomes disordered by the combining of elements in a manner which changes the elemental distributions in the material from that which would naturally occur. Compositional disorder, for example, is identified in the materials of the present invention by phases within the materials such as by the presence of crystallites, disordered grain boundaries including transitional phases, and grain boundary regions containing varying complexes and phases on constituent elements.

Translational disorder in the materials of the present invention is evident because the crystallites, grain boundaries and grain boundary regions are arranged at random. The crystallites are of varying sizes and orientations while the grain boundaries are of varying width and length dimensions. Configurational disorder is present in the materials of the present invention because the crystallites are of varying shapes having random and irregular surface configurations. The grain boundaries also randomly vary in configuration.

All of the above result in materials of the present invention which are very disordered accounting for the desirable low thermal conductivities while the highly conductive phases within the grain boundary regions form unique conduction paths between crystallites to provide high electrical conductivities. Electrically conductive paths are provided in the entire volume of the material which greatly increase the electrical conductivity while the thermal conductivity remains unaffected and even is desirably decreased. This result is not possible with crystalline materials.

As previously mentioned, the electrical conductivity of a material is ordinarily proportional to thermal conductivity. This holds true especially for crystalline materials. With such materials, it is extremely difficult to increase electrical conductivity without concomitantly increasing thermal conductivity. Since however, thermal conductivity is much more dependent on the long range atomic environment than electrical conductivity, disordered materials can attain large values of electrical conductivity while maintaining low thermal conductivities. Another important point is that since stoichiometry and purity are not factors in these materials as in conventional materials, a much greater latitude for manufacturing and lifetime stability are possible. These materials are enhanced or unaffected by disorder unlike prior crystalline or polycrystalline materials.

Another advantage of disordered materials, is that they are more flexible than crystalline materials. The disordered material is thus capable of more distortion during expansion and contraction allowing for greater mechanical stability during heating and cooling cycles of the material.

In general, and in accordance with the broader aspects of the present invention, the first and second compounds exhibit different crystalline structure or geometries to promote and facilitate the disordered structure of the resulting thermoelectric alloy when processed as disclosed hereinafter. As further logically postulated, the more dissimilar the crystalline structures or geometries of the first and second compounds, the more beneficial disorder of the final thermoelectric alloys results. The disorder which results is exemplified by matrix crystallites, principally of the first compound, bordered by disordered grain boundaries containing transitional phases, and grain boundary regions between the grain boundaries exhibiting a multiplicity of phases having significantly different electrical and thermal properties. For example, and in accordance with one embodiment of the present invention, the first compound can have rhombohedral crystalline structure and the second compound a face centered cubic crystalline structure. Compounds having a rhombohedral crystalline structure are, for example, in the class of materials represented by the $(Bi,Sb)_2Te_3$ continuous solid solution. As first compounds one alternatively could use compounds having a diamond crystalline structure, for example Si-Ge materials, or a face centered cubic crystalline structure such as PbS and PbTe. All of these materials, and most notably the $(Bi,Sb)_2Te_3$ materials when combined with a second compound of different crystalline structure are believed to be suitable for use in accordance with the invention.

To present a different crystalline structure for the first compounds having a rhombohedral or diamond crystalline structure, the second compound can be materials having, for example, a face centered cubic crystalline structure. Such materials include the $Ag_{25}Sb_{2.5}Te_{50}$ compound in accordance with one embodiment of the present invention. To present a different crystalline structure for the PbTe and PbS first compounds, the second compound can be a material having an orthorhombic crystalline structure, for example, $Ag_2Te$.

The first compound preferably also exhibits a satisfactory Seebeck coefficient because the first compound represents the majority of the bulk of the material and therefore is the constituent component relied upon to provide an acceptable Seebeck coefficient of the final thermoelectric material. Materials such as, for example, calcogenides of Group VB elements, such as bismuth and/or antimony, of which $(Bi,Sb)_2Te_3$ represents one group of such compounds, and known semiconductor materials such as lead sulfide (PbS), lead telluride (PbTe) and Si-Ge compounds all generally exhibit satisfactory Seebeck coefficients. Other materials which may be suitable for use as the first compound include materials having thermoelectric properties and containing Group VIB or VB elements, such as Bi,Sb materials and lead-tin tellurides.

It is anticipated that crystalline materials other than those disclosed herein will be suitable for use as the first and second components in accordance with the invention. For example, crystalline compounds which exhibit thermoelectric properties, especially those having Seebeck coefficients (S) of 100 $\mu v/°C$. or more, may be used. To be suitable, such compounds should be combinable with a minor amount of a second component, which has at least two elements capable of forming at least one highly electrically conductive phase when combined, to produce a disordered thermoelectric material having a higher electrical conductivity than the first compound along and/or a lower thermal conductivity than the first compound alone.

The second compound, when combined with the first compound in relatively minor amounts or proportions, should be capable of modifying the electrical and thermal properties of the first compound to result in a thermoelectric material having a higher electrical conductivity than the first compound alone and/or a lower thermal conductivity than the first compound alone.

To modify the electrical conductivity, the second compound when combined with the first compound forms a highly conductive phase or phases in the grain boundary regions. These highly conductive phases can be complexes of semiconductor elements with a least one element thereof being in higher concentrations than the other semiconductor element or elements, or complexes of highly conductive elements in high concentration with other, less conducting elements. Suitable modifying compounds are believed to include tellurides and antimonides of Group IB and IIIB transition metals, and more specifically, binary and ternary tellurides and antimonides of silver, gold, thallium and indium. Compounds falling into these classifications are AgTe, $Ag_2Te$, InSb, AgSb, AuTe, $Au_2Te$, AuSb, $Tl_2Te$, TlTe, TlSb, and TlSbTe for example, and in accordance with a preferred embodiment of the present invention, $Ag_{25}Sb_{25}Te_{50}$.

It is hypothesized that when the second compound is combined with the first compound by the process of the present invention, a significant amount of one of the elements of the second compound enters the bulk of the first compound leaving behind, in the grain boundary regions, complexes of the remaining elements of the second compound. These complexes represent phases which are rich in at least one of the elements. If the combined elements of the second compound are semiconductors when in equal proportions, the complexes of these elements will be highly conductive when one element is higher in concentration than the other element or elements. When one element is selectively introduced into the bulk, the minor portion thereof remaining in the grain boundary regions is believed to form the highly electrically conductive phases with the elements which are not introduced in the bulk.

The method of processing the first and second compounds to form the multiphase disordered alloys of the invention will now be described. The individual compounds are first prepared in solid form by any suitable method. Thereafter, the first and second components are crushed or otherwise pulverized into particulate form and mixed together in desired proportions to form a particulate solid mixture which is preferably uniform. The mixture is then heated to form a melt. Preferably, the mixture is heated to an elevated temperature for melting the first compound and partially melting the second compound. More specifically, the temperature of the melt should allow some phases of the second compound to precipitate. After heating, the melt is cooled, preferably utilizing a controlled temperature gradient.

The preferred elevated temperature and/or heating and cooling rates may vary depending on the particular first and second components utilized.

It is believed that the elevated temperature and heating and cooling rates may affect the configuration and size of the matrix crystallites and the disorder of the grain boundary regions and grain boundaries, which also may affect the thermoelectric characteristics of the thermoelectric materials of the invention. The amount of the second component which enters the bulk of the first component may also be related to the amount and rate of heating and cooling. Accordingly, it is anticipated that optimization of the heating and cooling process may be required for specific first and second components.

The multiphase disordered alloy materials of the present invention are preferably formed from heavy elements, for example, lead, bismuth, antimony, tellurium, and silver. Such heavy elements are noted for their low thermal conductivities. Such elements have low thermal conductivities because the phonon transport of such elements is decreased. The alloys of the present invention are also made from at least first and second multiple element compounds which are separately prepared and then combined. The first and second compounds are preferably prepared in solid form, crushed into solid particulate form and mixed together in desired proportions to form a particulate solid mixture. The mixture is then heated to an elevated temperature and then cooled by drawing through a temperature gradient.

As a result of this process, an alloy material results which differs substantially in structure, compositional distribution, and thermal and electrical properties from materials formed from the constituent elements alone. It will be appreciated that various combinations of first and second compounds are obtainable and can be optimized by simple experiment in which the desired properties are measured. In preferred embodiments, for making p-type thermoelectric alloys, the first compound includes bismuth, antimony, and tellurium in atomic proportions of ten to twenty percent bismuth, twenty to thirty percent antimony, and sixty percent tellurium. Preferably the first compound includes these elements in atomic proportions of ten, thirty, and sixty percent respectively ($Bi_{10}Sb_{30}Te_{60}$). For making n-type thermoelectric alloys the first compound can preferably include bismuth, tellurium, and selenium in atomic proportions of about forty percent bismuth, forty-two to fifty-four percent tellurium, and eighteen to six percent selenium. The second compound includes at least one element having high electrical conductivity, for example silver. The second compound may also include antimony and tellurium. The silver, antimony and tellurium compound preferably includes these elements in atomic proportions of twenty-five, twenty-five, and fifty percent respectively ($Ag_{25}Sb_{25}Te_{50}$). The first and second compounds are separately prepared in solid form and crushed. Thereafter, they are mixed together in desired proportions ranging from 97 to 99.75 percent of the first compound and 3 to 0.25 percent of the second compound to form a solid particulate mixture. The mixture is then heated to an appropriate elevated temperature, for example, about 600° to 650° and then cooled by a growing process identified herein as a modified vertical Bridgeman method. In this method, the mixture is contained within a quartz tube and drawn through a temperature gradient from its maximum temperature to room temperature.

The first compound exemplified by ($Bi_{10}Sb_{30}Te_{60}$) is crystalline having a rhombohedral crystalline structure and is a compound from the continuous solid solution $(Bi,Sb)_2Te_3$. The second compound, exemplified by ($Ag_{25}Sb_{25}Te_{50}$) is also crystalline, but has a face centered cubic crystalline structure which, of course, is different than the rhombohedral crystalline structure of the first compound. The resulting material is a new multiphase alloy material including a multiplicity of matrix crystallites separated by disordered grain boundaries and grain boundary regions. The structure of the resulting material is illustrated in FIG. 1, which is not drawn to scale to enable a more detailed representation of the material.

As previously mentioned, the alloy 10 includes a multiplicity of matrix crystallites 12. The crystallites are separated by disordered grain boundaries 14 and grain boundary regions 16. These transitional phases vary in composition from the composition of the matrix crystallites to the composition of the various phases in the grain boundary regions. The grain boundary regions 16 include various phases some of which being rich in silver forming highly conductive modifying phases 18 and even microcrystalline inclusions 20. The matrix crystallites 12 generally have width dimensions on the order of 10 microns and the grain boundary regions 16 are macroscopic in size varying from 0.1 to three microns.

EXAMPLE 1

The alloy referred to immediately above was specifically prepared in the following manner. One hundred grams of both the ternary compounds ($Bi_{10}Sb_{30}Te_{60}$) and ($Ag_{25}Sb_{25}Te_{50}$) were prepared separately by sealing the proper portions of the pure elements (99.999% purity) in an evacuated quartz tube of ½ inch inner diameter. The materials were maintained above the highet melting temperature of the elements for several hours and thoroughly mixed several times to ensure the complete reaction and homogeneity throughout the liquid. The materials were cooled to solid crystalline form and crushed. The desired amounts for the composition, here 99 percent $Bi_{10}Sb_{30}Te_{60}$, were weighed out in quantities on an analytical balance to an accuracy of $10^{-4}$ gram. The particulate materials were placed in a quartz tube of 4 millimeters inner diameter and 10 centimeters in length. The quartz tube was sealed and ready for the alloy growing process. The alloys were grown by a modified vertical Bridgeman method by vertically drawing the quartz tube through a temperature gradient ranging initially from 650° C. and decreasing to room temperature 20° C. The tube was drawn at a rate of 30 mm/hr under a constant temperature gradient of 30° C./cm. The grown alloy ingot was opened, cut, and annealed at 250° C. for about 20 hours.

The alloy was subjected to Energy Dispersive X-ray Analysis (EDS) using a 10 KEV accelerating voltage resulting in X-ray spatial resolution of $0.5\mu$. Spectrum acquired times of up to 1000 seconds were used. The EDS analysis revealed that the composition of the matrix crystallites 12 substantially corresponds to the composition of ($Bi_{10}Sb_{30}Te_{60}$). The crystallites are randomly oriented, have random sizes, and are of random shapes, all of which contribute to the desired disorder. Areas of the fractured grain boundary plane consisted of Ag-Te with no antimony (Sb) or bismuth (Bi). The silver to tellurium ratio in the grain boundary regions varies with a noticeable amount up to 2:1 or hence, the composition noted therein was $Ag_2Te$. Other complexes of silver and tellurium were also noted. Several areas in the grain boundaries also were found to consist of 100 percent tellurium.

The foregoing analysis illustrates that the alloys of the present invention are very disordered. The analysis also confirms that when the two separate compounds are combined, the antimony of the $Ag_{25}Sb_{25}Te_{50}$ compound disperses into the bulk leaving silver and tellurium at the grain boundaries 14 and in the grain boundary regions 16. The presence of the highly electrically conductive element, silver, in the grain boundary regions is instrumental in obtaining the high electrical conductivity of the resulting alloys. Also, the extreme disorder of the grain boundaries and the non-highly thermally conductive modifying phases including the silver rich tellurium phases in the grain boundary regions 16 account for the desired low thermal conductivity of the alloys.

The $Bi_{10}Sb_{30}Te_{60}$ crystalline compound is a currently available material used in thermoelectric applications. To illustrate the desired properties obtainable from the alloys of the present invention, reference may be made to the table below which compares the room temperature Seebeck coefficient (S), the electrical conductivity ($\sigma$), and the lattice thermal conductivity (Kl) of the $Bi_{10}Sb_{30}Te_{60}$ compound to an alloy of the present invention formed from 99 percent $Bo_{10}Sb_{30}Te_{60}$ and 1 percent $Ag_{25}Sb_{25}Te_{50}$ by the method of the present invention more particularly described hereinafter.

| | $Bi_{10}Sb_{30}Te_{60}$ | $(Bi_{10}Sb_{30}Te_{60})_{99} + (Ag_{25}Sb_{25}Te_{50})_1$ |
|---|---|---|
| S($\mu v/°C.$) | 160 | 120 |

-continued

| | $Bi_{10}Sb_{30}Te_{60}$ | $(Bi_{10}Sb_{30}Te_{60})_{99} + (Ag_{25}Sb_{25}Te_{50})_1$ |
|---|---|---|
| $(\Omega\text{-cm})^{-1}$ | 1250 | 4000 |
| $K_l$ (mW/cm/°K) | 15 | 10 |

From the above table, it can be seen that the electrical conductivity of the new alloy is three times that of the prior art crystalline material and that the thermal conductivity of the new alloy is two-thirds of that of the prior art material. Although the Seebeck coefficient of the new alloy is twenty percent less than the prior art material, the resulting figure of merit is much higher due to the substantially higher electrical conductivity and substantially lower thermal conductivity. Therefore, it can be seen that the present invention provides greater independent control of the important parameters which is not available in the prior crystalline or polycrystalline materials.

EXAMPLES 2-5

Various alloys having proportions of 97 percent to 99.75 percent $Bi_{10}Sb_{30}Te_{60}$ and 3 percent to 0.25 percent $Ag_{25}Sb_{25}Te_{50}$ made by the foregoing method have all shown desirable thermoelectric properties, especially over the 100 to 200° C. range. FIGS. 2 through 5 are graphs illustrating the figure merit, electrical conductivity, thermal conductivity, and Seebeck coefficient for the alloys listed below fabricated by the above-described method.

| Example | |
|---|---|
| 2 | $(Bi_{10}Sb_{30}Te_{60})_{99.5} + (Ag_{25}Sb_{25}Te_{50})_{.5}$ |
| 3 | $(Bi_{10}Sb_{30}Te_{60})_{99} + (Ag_{25}Sb_{25}Te_{50})_1$ |
| 4 | $(Bi_{10}Sb_{30}Te_{60})_{98.5} + (Ag_{25}Sb_{25}Te_{50})_{1.5}$ |
| 5 | $(Bi_{10}Sb_{30}Te_{60})_{98} + (Ag_{25}Sb_{25}Te_{50})_2$ |

The curves for the various alloys are indicated by the percent incorporation of the $Ag_{25}Sb_{25}Te_{50}$ compound. As can be observed when comparing the electrical conductivities of the alloys illustrated in FIG. 3 to the thermal conductivities illustrated in FIG. 4, the electrical conductivity of the alloy can be controlled by the amount of the second compound ($Ag_{25}Sb_{25}Te_{50}$) incorporated into the alloy. While the electrical conductivity can be controlled, the thermal conductivities remain sustantially the same for each alloy.

Figure 5:
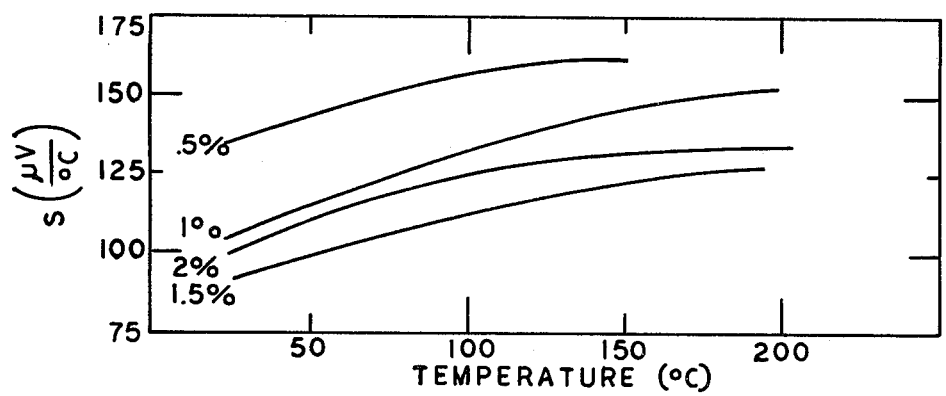
FIG. 5 is a graph illustrating the Seebeck coefficient (S) versus temperature for various alloys of the present invention.

It will also be noted from FIG. 5 that the Seebeck coefficient appears to decrease somewhat with increased incorporation of the second compound. However, once one percent incorporation of the second compound is reached, the Seebeck coefficient does not vary substantially.

Figure 2:
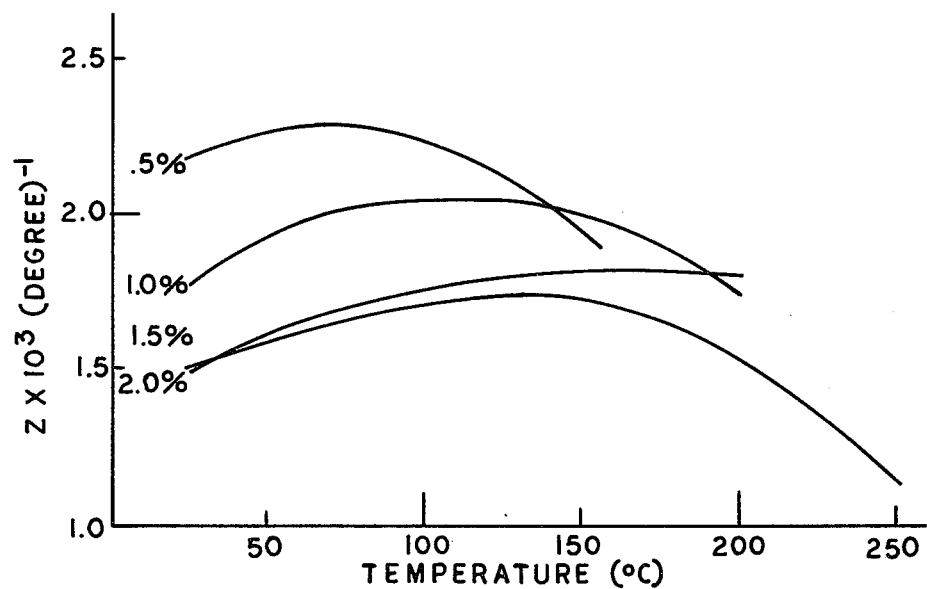
FIG. 2 is a graph illustrating the figure of merit (Z) versus temperature for various alloys of the present invention.
Figure 3:
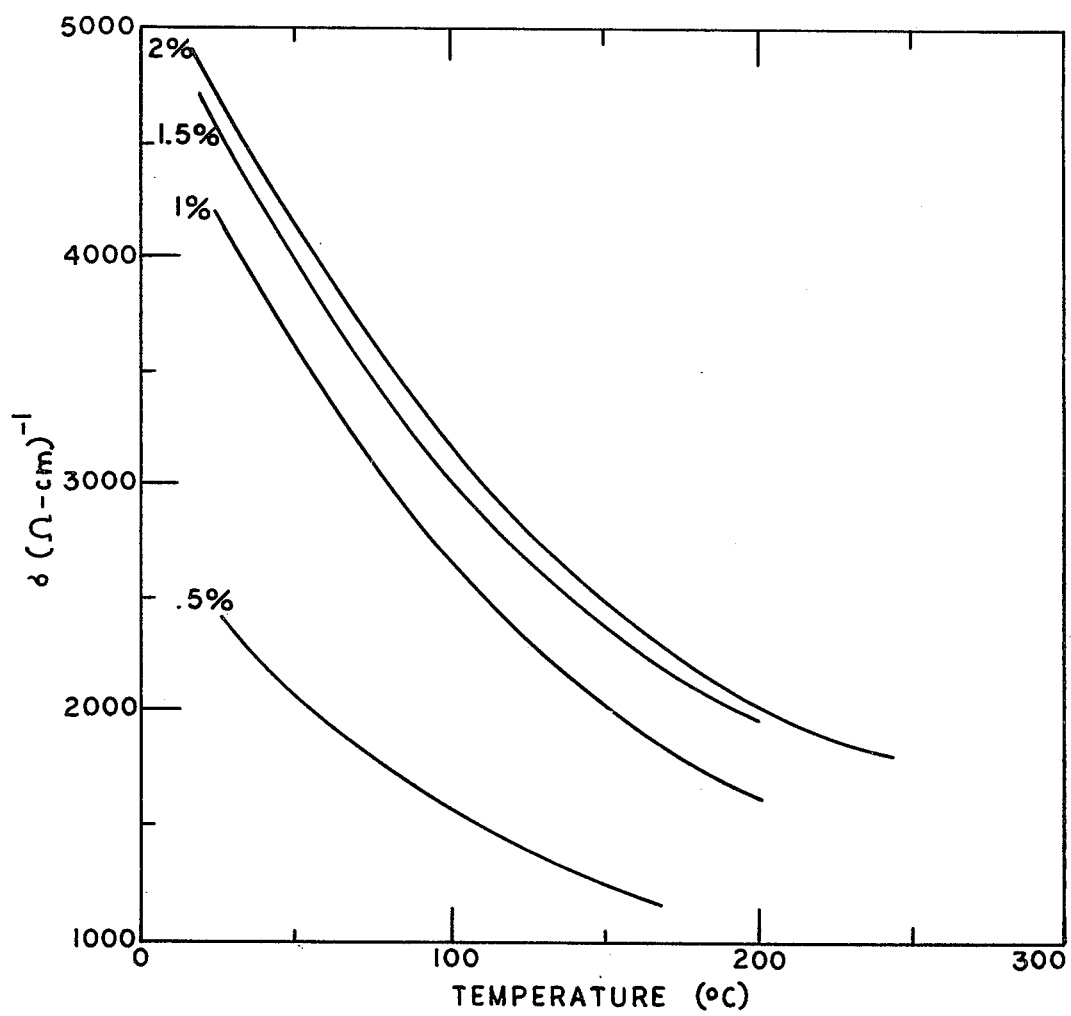
FIG. 3 is a graph illustrating electrical conductivity ($\sigma$) versus temperature for various alloys of the present invention.
Figure 4:
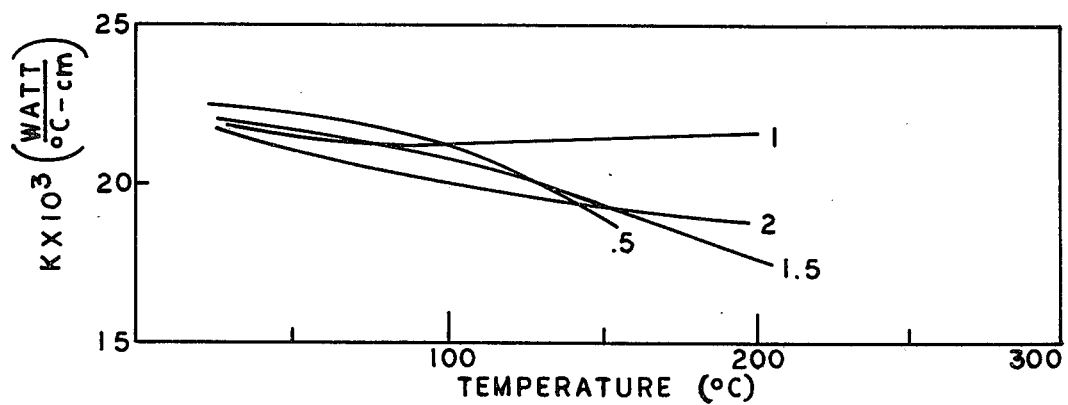
FIG. 4 is a graph illustrating thermal conductivity (K) versus temperature for various alloys of the present invention.

The curves of FIG. 2 of course represent the combined effects of the parameters illustrated in FIGS. 3-5. Here it can be seen that the alloy having about 0.5 percent of the second compound exhibits the best figure of merit up to about 140° C. From about 140° C. to 200° C. the alloy containing about 1 percent of the second compound exhibits the best figure of merit. Hence, not only do the alloys of the present invention exhibit good figures of merit in the very important 100° to 200° C. temperature range, but in addition, the alloys can be tailored by the appropriate amount of incorporation of the second compound for optimized thermoelectric performance within desired temperature ranges. These unique results are also reflected in stability and ease of fabrication.

Figure 6:
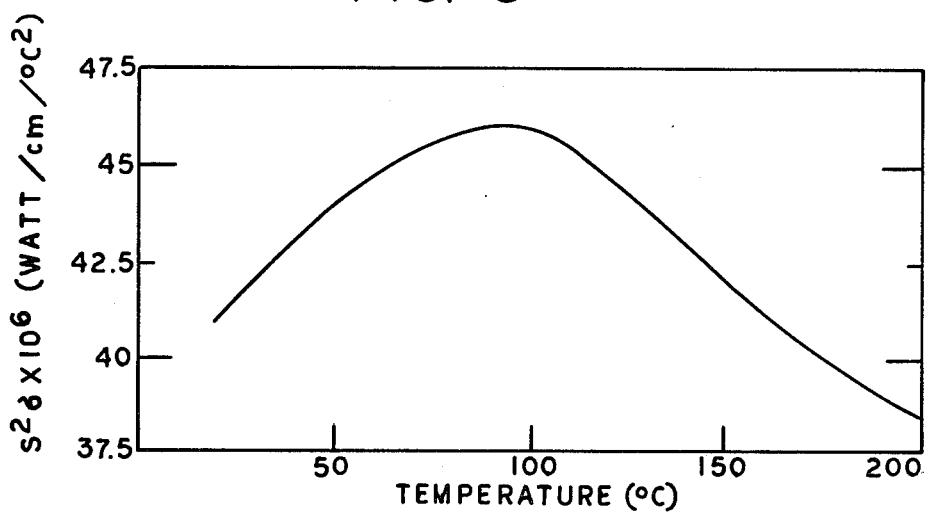
FIG. 6 is a graph of $S^2\sigma$ versus temperature for various alloys of the present invention.

FIG. 6 shows the $S^2\sigma$ product for the $(Bi_{10}Sb_{30}Te_{60})_{99} + (Ag_{25}Sb_{25}Te_{50})_1$ alloy over the temperature range of about 10° C. to 200° C. It is noted that this product is maximum at about 100° C. It is at this point that the figure of merit of this material also begins to reach its maximum while its thermal conductivity is slightly increasing.

Confirming that the concept of the present invention is a general concept, we have found that the alloy can contain either p-type or n-type dopants. Among these one can use a p-type dopant such as lead. Other dopants such as tellurium iodide ($TeI_4$) or tellurium, well known in the art as n-type dopants, can also be used in practicing the invention. The dopant, preferably tellurium iodide ($TeI_4$), is incorporated into the alloy to maximize the $S^2\sigma$ product by adding the same to the first compound ($Bi_{10}Sb_{30}Te_{60}$) during its preparation. For example, only between 0.1 and 1 percent of the tellurium iodide is required. Alternatively, other n-type dopants such as cadmium chloride ($CdCl_2$), zinc chloride ($ZnCl_2$), or mercury chloride ($HgCl_2$) can also be used.

EXAMPLES 6-10

Figure 7:
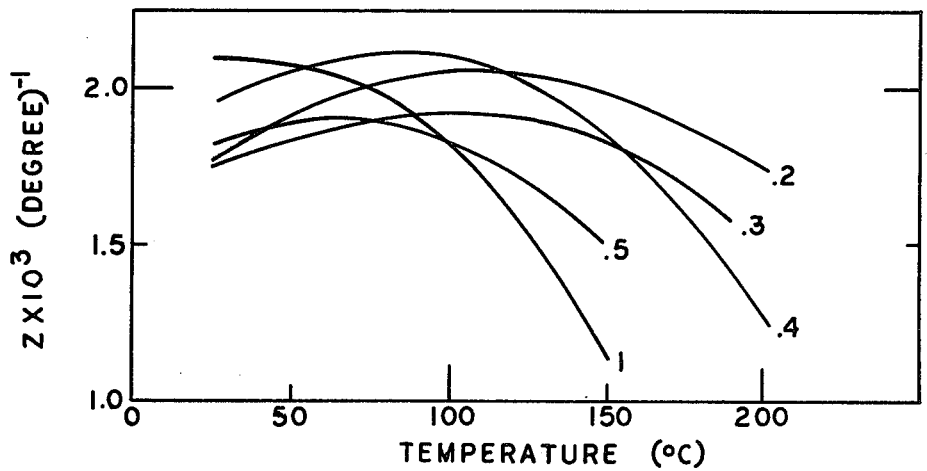
FIG. 7 is a graph illustrating the figure of merit (Z) versus temperature for one alloy of the present invention having various concentrations of tellurium iodide therein.

FIG. 7 illustrates the figure of merit for the $(Bi_{10}Sb_{30}Te_{60})_{99} + (Ag_{25}Sb_{25}Te_{50})_1$ alloy over the temperature range of about 25° C. to 200° C. for concentrations of $TeI_4$ of 0.2, 0.3, 0.4, 0.5, and 1 percent.

It can here be noted that the alloy exhibits its best figure of merit from about 50° C. to about 120° C. when incorporating about 0.4 percent $TeI_4$. From about 120° C. its figure of merit is best when including about 0.2 percent $TeI_4$. For the entire temperature range displayed, the alloy containing about 0.2 percent $TeI_4$ exhibits the best overall figure of merit. Here again, it is seen that the alloys of the present invention can be made by the inventive method to tailor the alloys for particular characteristics over desired different temperature ranges.

EXAMPLE 11

The starting n-type material used in this example has the composition of $Bi_{40}Te_{54}Se_6$ doped with 0.15% cadmium chloride ($CdCl_2$) and was alloyed with 1% ($Ag_{25}Sb_{25}Te_{50}$). The alloy was synthesized at 800° C. for 2 hours before growing in the Bridgeman furnace at a speed of 10 mm/hr. The electrical conductivity ($\sigma$) increased by the alloying and the Seebeck coefficient (S) had higher values than those of the starting $Bi_{40}Te_{54}Se_6$ material in the temperature region above 150° C. The figure of merit (Z) had the same temperature behavior as the Seebeck coefficient (S). Therefore the standard n-type thermoelectric material $Bi_2(Te,Se)_3$ can be improved as the p-type material, by practicing the concept of the present invention.

EXAMPLES 12-15

The n-type alloys of Examples 12-15 have the composition:

(X w/o $TeI_4$ doped $Bi_{40}Te_{48}Se_{12})_{99} + (Ag_{25}Sb_{25}Te_{50})_1$ where X equals 0, 0.05, 0.10, and 0.20.

These alloys were prepared by first separately synthesizing the doped and undoped bismuth, tellurium, and selenium first compounds and the silver, antimony, and tellurium second compound by weighing out the respective constituent elements thereof in proper proportions, sealing in a quartz tube at $10^{-5}$ Torr, and melting at 800° C. for two hours. Thereafter, the melts were rapidly quenched. Each of the first compounds was then combined with the second compound in the indicated proportions in particulate mixture form and melted at 800° C. for several hours. After cooling, each of the four compounds was then placed into a respective quartz tube of 5 mm inner diameter. The quartz tubes were evacuated to $10^{-5}$ Torr and heated to about 650° C. and drawn through a temperature gradient of 30° C./cm at a rate of 10 mm/hr down to room temperature.

Figure 8:
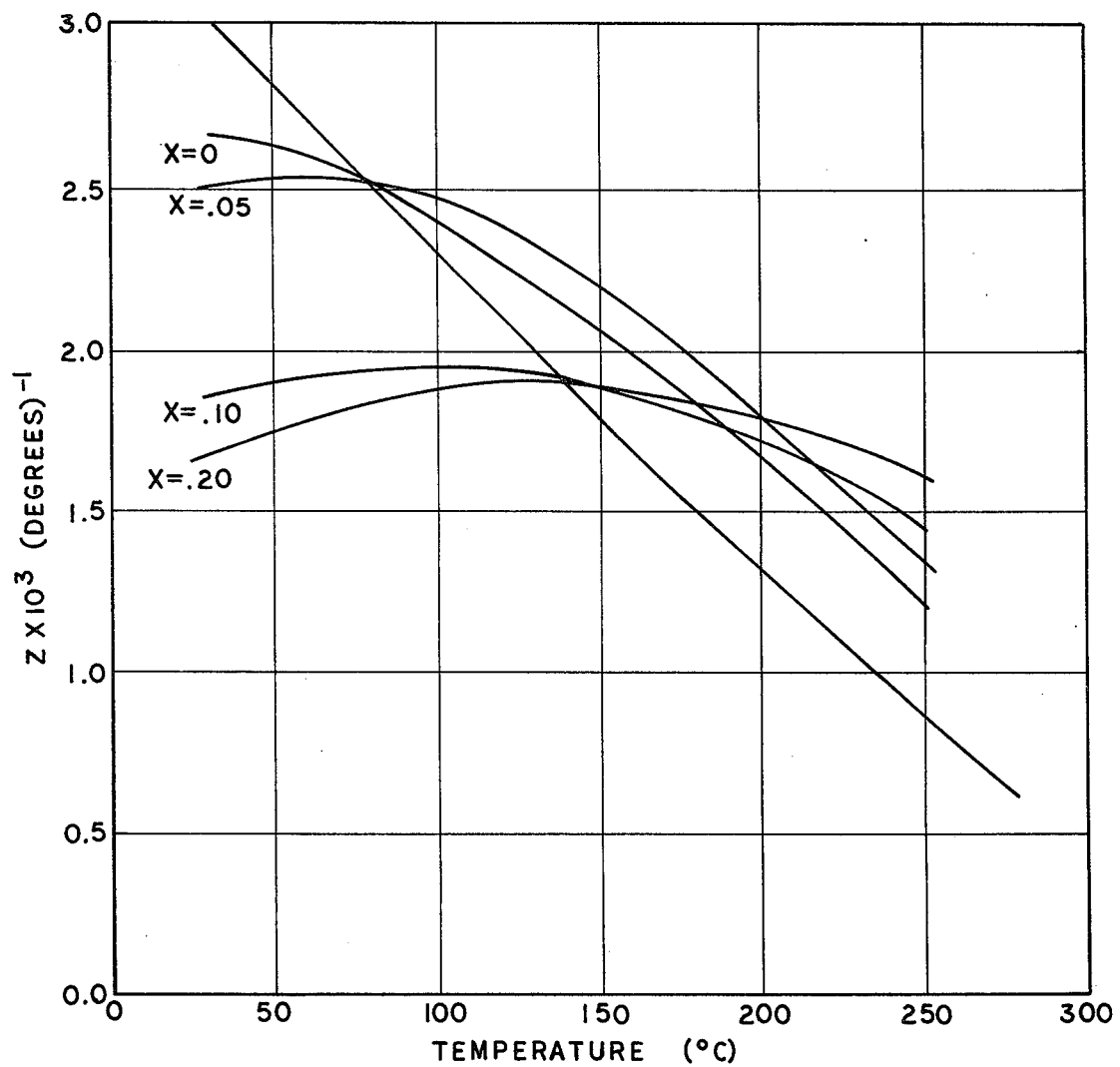
FIG. 8 is a graph illustrating the figure of merit (Z) versus temperature for the n-type alloys of Examples 12-15 of the present invention having various concentrations of tellurium iodide therein.

FIG. 8 illustrates the figure of merit (Z) versus temperature for each of these alloys and the conventional prior art polycrystalline $Bi_2(Te,Se)_3$ material. As can be noted, the undoped alloy and the alloy having 0.05 w/o tellurium iodide have greater figures of merit than the conventional material above about 80° C. while the alloys having 0.10 and 0.20 w/o tellurium iodide have greater figures of merit than the conventional material above about 140° C. The alloy having 0.20 w/o tellurium iodide has the best figure of merit above about 200° C. Hence, the figure of merit can be tailored for desired temperature ranges by varying the dopant concentration.

Also significant is the fact that at 250° C., the alloy having 0.20 w/o tellurium iodide has a figure of merit which is almost twice that of the conventional material. This is important because the product of the figure of merit and temperature (ZT) is directly related to the efficiency of a material in converting a temperature differential into electrical energy. Hence, at a temperature of 250° C., corresponding to many waste heat applications, this alloy is capable of being nearly 100 percent more efficient than the convention material.

EXAMPLES 16–18

The n-type alloys of Examples 16–18 have the composition:

(X w/o $TeI_4$ doped $Bi_{40}Te_{42}Se_{18})_{99}$+$(Ag_{25}Sb_{2.5}Te_{50})_1$ where X equals 0, 0.10, and 0.20.

These alloys were prepared by a method identical to that described above for the preparation of the n-type alloys of Examples 12–15.

Figure 9:
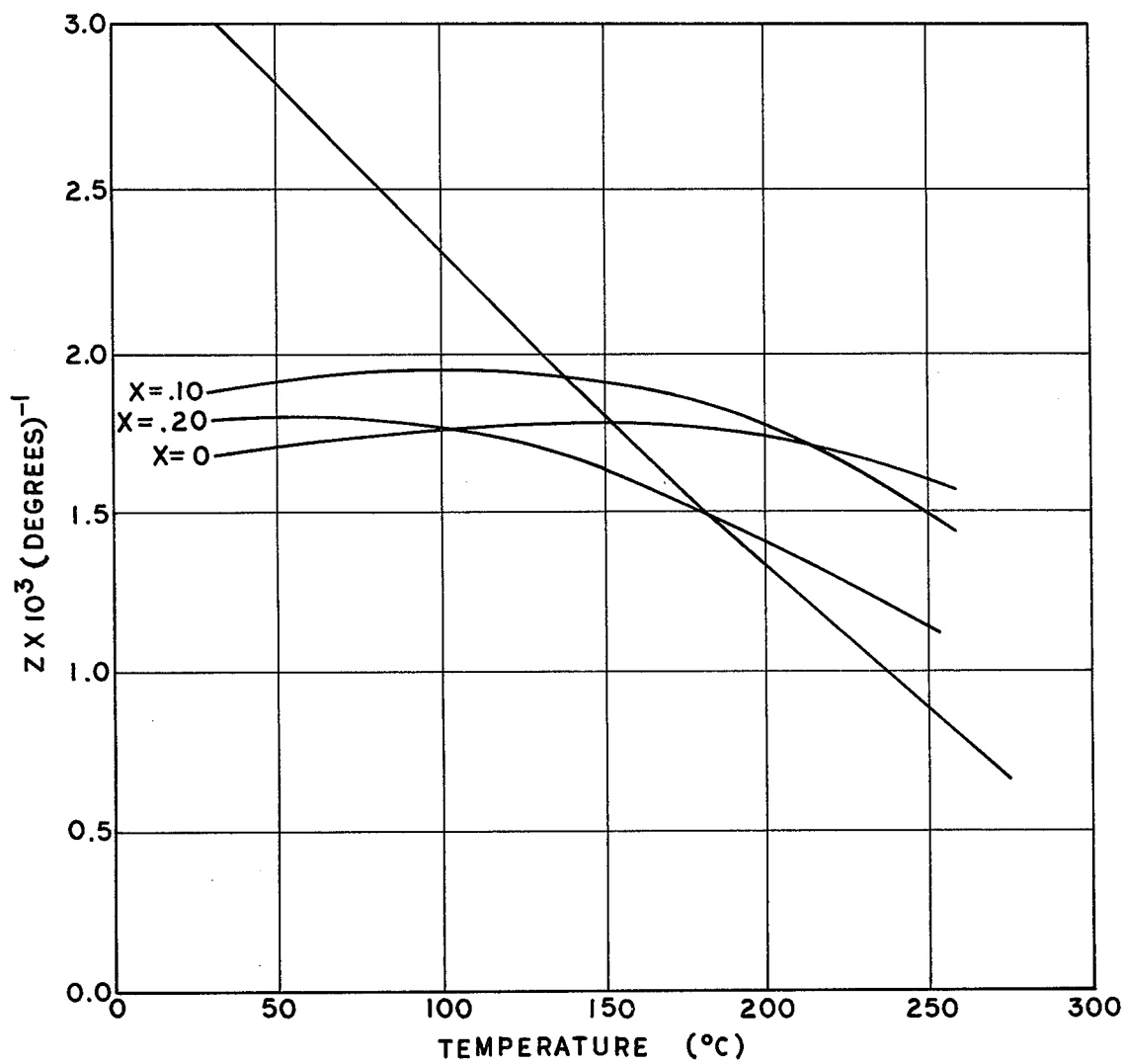
FIG. 9 is a graph illustrating the figure of merit (Z) versus temperature for the n-type alloys of Examples 16-18 of the present invention having various concentrations of tellurium iodide therein.

FIG. 9 illustrates the figure of merit (Z) versus temperature for each of these alloys and the conventional prior art polycrystalline $Bi_2(Te,Se)_3$ material. As can be seen, the undoped alloy has a greater figure of merit than the conventional material above about 130° C. The alloys containing 0.10 and 0.20 weight percent tellurium iodide have greater figures of merit above about 140° C. and 175° C., respectively. The undoped alloy has the best figure of merit above about 220° C. FIG. 9, therefore, further illustrates that, by varying the dopant concentration, the figure of merit can be tailored for a specific temperature range.

Also, note here again, that at 250° C., the undoped alloy has a figure of merit approximately twice that of the conventional polycrystalline material. As explained above with respect to FIG. 8, this makes the alloy far more desirable than conventional materials at temperatures corresponding to many waste heat applications.

From the foregoing, it can be appreciated that the present invention provides new and improved alloys for thermoelectric applications and methods for making the same. Because the alloys are disordered, the electrical conductivities thereof can be tailored as desired without adversely affecting the thermal conductivities thereof. Also, certain of the alloys of the present invention are suited for thermoelectric applications in the important temperature range of 100° C. to 200° C. In that range, they exhibit figures of merit of at least 25 percent up to 40 percent better than known prior art crystalline materials. Their ease of manufacture and stability of operation are far superior to prior materials which demand purity, stoichiometry and defect control.

In addition to the foregoing, it is not necessary that both the first and second compounds be electrically conductive. In fact, the $Ag_{25}Sb_{25}Te_{50}$ compound does not, by itself, exhibit good electrical conductivity. However, when it is combined with the second compound, by virtue of the macroscopic modification of the present invention, new and improved thermoelectric alloys result which have higher electrical conductivity than either of the constituent compounds alone. It is also not necessary that one of the compounds be a good thermoelectric material by itself although it is preferred that at least one of the compounds exhibit a suitable Seebeck coefficient. By the method of the present invention, new and improved thermoelectric materials can be fabricated from a material having a satisfactory Seebeck coefficient but having unsatisfactory electrical and thermal conductivity properties. Further, it is also not necessary that the first and second compounds be rhombohedral and face centered cubic respectively in crystalline geometrics. Other forms of geometrics are permitted in practicing the present invention.

Modifications and variations of the present invention are possible in light of the above teachings. It is therefore, to be understood that within the scope of the appended claims the invention may be practiced otherwise than as specifically described.

What is claimed and described to be secured by letters patent of the United States is:

1. A material for thermoelectric applications having low thermal conductivity and high electrical conductivity, said material comprising:
    a first phase including a multiplicity of matrix crystallites, said crystallites being separated by macroscopic grain boundary regions containing at least one modifying phase introduced therein to increase the electrical conductivity of said material.

2. A material as defined in claim 1 wherein said one modifying phase modifies the matrix of said material by controlling the electrical conductivity independently of said thermal conductivity.

3. A material as defined in claim 2 comprising a further phase for independently controlling the thermal conductivity of said material.

4. A material as defined in claim 3 wherein said further phase is adapted to reduce the thermal conductivity of said material.

5. A material as defined in claim 1 wherein said at least one additional phase includes at least one element having high electrical conductivity.

6. A material as defined in claim 5 wherein said at least one element having high electrical conductivity is silver.

7. A material as defined in claim 1 further including a dopant.

8. A material as defined in claim 7 wherein said dopant is a tellurium iodide ($TeI_4$).

9. A material as defined in claim 8 wherein said material includes 0.1 percent to 1 percent of said tellurium iodide.

10. A material as defined in claim 9 wherein said material includes about 0.2 percent of said tellurium iodide.

11. A material for thermoelectric applications having low thermal conductivity and high electrical conductivity, said material comprising:
a first phase including a multiplicity of matrix crystallites, said crystallites being separated by macroscopic grain boundary regions containing at least one modifying phase introduced therein to reduce the thermal conductivity of said material.

12. A material as defined in claims 1 or 11 wherein said crystallites include at least bismuth, tellurium and antimony.

13. A material as defined in claims 1 or 11 wherein said grain boundary regions include at least silver and tellurium.

14. A material as defined in claims 1 or 11 wherein said grain boundary regions include silver and tellurium and multiple phases thereof.

15. A material as defined in claims 1 or 11 wherein said material includes at least bismuth, tellurium, antimony, and silver.

16. A material as defined in claim 1 or 11 wherein said material includes about 10 to 20 percent bismuth, about 20 to 30 percent antimony, about 60 percent tellurium and less than 1 percent silver.

17. A material as defined in claims 1 or 11 further comprising grain boundaries between said matrix crystallites and said grain boundary regions and wherein said grain boundaries includes transitional phases.

18. A material as defined in claim 17 wherein said transitional phases vary in composition from the composition of said crystallites to the composition of the phases within said grain boundary regions.

19. A material as defined in claims 1 or 11 wherein said grain boundary regions further include microcrystalline inclusions.

20. A material as defined in claims 1 or 11 wherein said grain boundary regions vary in dimension up to about three microns.

21. A material as defined in claims 1 or 11 wherein said matrix crystallites have a width dimension on the order of ten microns.

22. A material as defined in claims 1 or 11 wherein said material includes at least bismuth, tellurium, and selenium.

23. A material as defined in claim 22 wherein said material includes about 40 percent bismuth, about 42 to 54 percent tellurium, and about 18 to 6 percent selenium.

24. A material as defined in claim 23 wherein said material includes a dopant.

25. A material as defined in claim 24 wherein said dopant is tellurium iodide.

26. A material as defined in claim 25 wherein said material includes about 0.05 to 0.2 percent tellurium iodide.

27. A material as defined in claim 26 wherein said material includes about 0.2 percent tellurium iodide.

28. A material as defined in claim 24 wherein said dopant is cadmium chloride.

29. A material as defined in claim 22 wherein said material further includes silver.

30. A material for thermoelectric applications having low thermal conductivity and high electrical conductivity, said material comprising:
a multiplicity of matrix crystallites including at least bismuth, tellurium, and antimony, said crystallites being separated by disordered grain boundaries bordering said crystallites and grain boundary regions between said grain boundaries, said grain boundary regions including a plurality of phases including electrically conductive phases including at least one element having high electrical conductivity, and said grain boundaries including transitional phases varying in composition from the composition of said crystallites to the composition of said phases within said grain boundary regions.

31. A material as defined in claim 30 wherein said at least one element having high electrical conductivity is silver.

32. A method of making a material for thermoelectric applications having low thermal conductivity and high electrical conductivity, said method comprising the steps of:
forming a mixture of at least first and second multiple element compounds, at least one of said compounds including at least one element having high electrical conductivity, heating said mixture to an elevated temperature, and thereafter cooling said mixture to form from said mixture of compounds a multiphase solid alloy material differing substantially in macroscopic structure, compositional distribution and thermal and electrical properties from a material formed from the constituent elements of said compounds alone, said multiphase alloy comprising a first phase of a multiplicity of matrix crystallites separated by macroscopic disordered grain boundary regions having at least electrically conductive phases with said at least one element having high electrical conductivity therein.

33. A method as defined in claim 32 comprising the furthur step of annealing said multiphase solid alloy material at about 250° C. for about 20 hours.

34. A method as defined in claim 32 comprising the further step of preparing said first and second compounds in solid particulate form and wherein said mixture is heated to a temperature of about 650° C.

35. A method as defined in claim 34 wherein said mixture is cooled to room temperature.

36. A method as defined in claim 35 wherein said mixture is cooled by drawing said mixture through a temperature gradient.

37. A method as defined in claim 36 wherein said mixture is drawn at a rate of 30 mm per hour through a temperature gradient of 30° C./cm.

38. A method as defined in claim 32 wherein said first and second multiple element compounds are crystalline and have different crystalline geometries.

39. A method as defined in claim 38 wherein one said compound has a face centered cubic crystalline structure and the other said compound has a rhombohedral crystalline structure.

40. A method as defined in claim 32 wherein said first multiple element compound includes bismuth, antimony, and tellurium.

41. A method as defined in claim 40 wherein said second multiple element compound includes silver, antimony, and tellurium.

42. A method as defined in claim 41 wherein said first compound comprises 10 to 20 percent bismuth, 20 to 30 percent antimony, and 60 percent tellurium.

43. A method as defined in claim 42 wherein said second compound comprises 25 percent silver, 25 percent antimony, and 50 percent tellurium.

44. A method as defined in claim 43 wherein said first and second compounds are mixed together in the proportion of 97 to 99.75 percent of said first compound with 3 to 0.25 percent of said second compound.

45. A method as defined in claim 32 further comprising the step of adding a dopant to said first compound prior to forming said mixture of said compounds.

46. A method as defined in claim 45 wherein said dopant is tellurium iodide (TeI$_4$).

47. A method as defined in claim 46 wherein between about 0.1 percent to 1 percent tellurium iodide is added to said first compound.

48. A method as defined in claim 47 wherein about 0.2 percent tellurium iodide is added to said first compound.

49. A method as defined in claim 32 wherein said first multiple element compound includes bismuth, tellurium, and selenium.

50. A method as defined in claim 49 wherein said second multiple element compound includes silver, antimony, and tellurium.

51. A method as defined in claim 51 wherein said first compound includes 40 percent bismuth, 42 to 54 percent tellurium, and 18 to 6 percent selenium.

52. A method as defined in claim 50 wherein said second compound includes 25 percent silver, 25 percent antimony, and 50 percent tellurium.

53. A method as defined in claim 52 wherein said first and second compounds are mixed together in the proportions of 99 percent of said first compound with 1 percent of said second compound.

54. A method as defined in claim 49 further comprising the step of adding a dopant to said first compound prior to forming said mixture of said compounds.

55. A method as defined in claim 54 wherein said dopant is tellurium iodide.

56. A method as defined in claim 55 wherein between about 0.05 to 0.20 percent tellurium iodide is added to said first compound.

57. A method as defined in claim 56 wherein about 0.2 percent tellurium iodide is added to said first compound.

58. A method as defined in claim 54 wherein said dopant is cadmium chloride.

59. A method of making a material for thermoelectric applications having low thermal conductivity and high electrical conductivity, said method comprising:
    forming a particulate solid mixture of 97 to 99.75 percent of a first multiple element compound and 3 to 0.25 percent of a second multiple element compound, said first compound comprising Bi$_{10}$Sb$_{30}$Te$_{60}$ and said second compound comprising Ag$_{25}$Sb$_{25}$Te$_{50}$;
    heating said mixture to an elevated temperature; and thereafter cooling said mixture to form said material in solid form.

60. A method as defined in claim 59 wherein said mixture is cooled by the step of drawing said mixture through a temperature gradient.

61. A method as defined in claim 60 wherein said mixture is drawn at a rate of about 30 mm/hr through a temperature gradient of 30° C./cm.

62. A method as defined in claim 59 wherein said mixture is heated to a temperature of about 600° to 650° C.

63. A method as defined in claim 59 comprising the further step of adding a dopant to said Bi$_{10}$Sb$_{30}$Te$_{60}$ prior to forming said mixture.

64. A method as defined in claim 63 wherein said dopant is tellurium iodide.

65. A method as defined in claim 64 wherein about 0.1 percent to 1 percent of said tellurium iodide is added to said Bi$_{10}$Sb$_{30}$Te$_{60}$.

66. A method as defined in claim 65 wherein about 0.2 percent of said tellurium iodide is added to said Bi$_{10}$Sb$_{30}$Te$_{60}$.

67. A method as defined in claim 59 wherein said particulate solid mixture is formed by mixing 99.5 percent Bi$_{10}$Sb$_{30}$Te$_{60}$ with 0.5 percent Ag$_{25}$Sb$_{25}$Te$_{50}$.

68. A method as defined in claim 59 wherein said particulate solid mixture is formed by mixing 99 percent Bi$_{10}$Sb$_{30}$Te$_{60}$ with 1 percent Ag$_{25}$Sb$_{25}$Te$_{50}$.

69. A method as defined in claim 59 wherein said particulate solid mixture is formed by mixing 98.5 percent Bi$_{10}$Sb$_{30}$Te$_{60}$ with 1.5 percent Ag$_{25}$Sb$_{25}$Te$_{50}$.

70. A method as defined in claim 59 wherein said particulate solid mixture is formed by mixing 98 percent Bi$_{10}$Sb$_{30}$Te$_{60}$ with 2 percent Ag$_{25}$Sb$_{25}$Te$_{50}$.

71. A method as defined in claim 59 comprising the further step of annealing said material at about 250° C. for about 20 hours.

72. A method of making a material for thermoelectric applications having low thermal conductivity and high electrical conductivity, said method comprising the steps of:
    providing a first multiple element compound having a thermal conductivity and an electrical conductivity;
    providing a second multiple element compound, said second compound including at least one element capable of forming electrically conductive phases with at least one element of said first compound when combined;
    forming a solid particulate mixture including 97 percent to 99.75 percent of said first compound with 3 percent to 0.25 percent of said second compound;
    heating said mixture; and thereafter
    cooling said mixture to form a solid multiphase alloy material, said material having a disordered structure differing substantially from that of a material formed from the constituent elements of said first and second compounds alone, said multiphase alloy also having a thermal conductivity lower than the thermal conductivity of said first compound and an electrical conductivity higher than the electrical conductivity of said first compound.

73. A thermoelectric alloy material comprising a combination of first and second multiple element crystalline compounds having different melting points, said first compound having thermoelectric properties and said second compound having at least two elements capable of forming at least one highly electrically conductive phase when combined such that one element is of higher concentration than the other element, said alloy formed from a mixture of said compounds that has been heated to a temperature equal to or above the melting point of one of said compounds and below the melting point of said other compound and thereafter drawn through a cooling gradient to form from the heated mixture said thermoelectric alloy material in solid form, said alloy differing substantially from an alloy formed from a mixture of the constituent elements of said first and second multiple element crystalline compounds in that said alloy formed from said mixture of said compounds comprises a first phase of a multiplicity of matrix crystallites separated by macroscopic disordered grain boundary regions having at least said one highly electrically conductive phase therein.

74. A thermoelectric alloy material as defined in claim 73 wherein said first compound has a higher melting point than said second compound.

75. A thermoelectric alloy material as defined in claim 73 wherein said first and second compounds have different crystal structures.

76. A thermoelectric alloy material as defined in claim 75 wherein said first compound has a rhombohedral crystal structure.

77. A thermoelectric alloy material as defined in claim 75 wherein said first compound has a diamond crystal structure.

78. A thermoelectric alloy material as defined in claim 76 or 77 wherein said second compound has a face centered cubic crystal structure.

79. A thermoelectric alloy material as defined in claim 73 wherein said first compound is at least one compound selected from the group consisting of $(Bi,Sb)_2Te_3$ compounds.

80. A thermoelectric alloy material as defined in claim 79 wherein said first compound is $Bi_{10}Sb_{30}Te_{60}$.

81. A thermoelectric alloy material as defined in claim 73 wherein said first compound includes lead.

82. A thermoelectric alloy material as defined in claim 81 wherein said first compound is PbTe.

83. A thermoelectric alloy material as defined in claim 73 wherein said first compound is Si-Ge.

84. A material as defined in claim 73 wherein said first compound has a satisfactory Seebeck coefficient (S).

85. A thermoelectric alloy material as defined in claim 73 wherein said second compound is a telluride or antimonide of Group IB or IIIB transition metals.

86. A thermoelectric alloy material as defined in claim 85 wherein said second compound is a binary or ternary telluride or antimonide of silver, gold, thallium, or indium.

87. A thermoelectric alloy material as defined in claim 86 wherein said second compound is selected from the group consisting of AgTe, $Ag_2Te$, InSb, AgSb, AuTe, $Au_2Te$, AuSb, $Tl_2Te$, TlTe, TlSb, TlSbTe, and $Ag_{25}Sb_{25}Te_{50}$.

88. A thermoelectric alloy material as defined in claim 73 wherein said at least one highly electrically conductive phase comprises $Ag_2Te$.

89. A method of making a thermoelectric alloy material comprising:
  (a) forming a mixture of first and second multiple element crystalline compounds having different melting points, said first compound having thermoelectric properties and said second compound having at least two elements capable of forming at least one highly electrically conductive phase when combined such that one element is of higher concentration than the other element;
  (b) heating said mixture to a temperature equal to or above the melting point of one of said compounds and below the melting point of said other compound to form a melt; and
  (c) cooling said melt to form said thermoelectric alloy material in solid form which alloy differs substantially from materials formed from the constituent elements of said first and second compounds alone in that said alloy material comprises a first phase of a multiplicity of matrix crystallites separated by macroscopic disordered grain boundary regions having at least said one highly electrically conductive phase therein.

90. A method as defined in claim 89 wherein said first and second compounds have different crystal structures.

91. A method as defined in claim 90 wherein said first compound has a rhombohedral crystal structure.

92. A method as defined in claim 90 wherein said first compound has a diamond crystal structure.

93. A method as defined in claim 91 or 92 wherein said second compound has a face centered cubic crystal structure.

94. A method as defined in claim 89 wherein said first compound is at least one compound selected from the group consisting of $(Bi,Sb)_2Te_3$ compounds.

95. A method as defined in claim 94 wherein said first compound is $Bi_{10}Sb_{30}Te_{60}$.

96. A method as defined in claim 89 wherein said first compound is a calcogenide of bismuth and/or antimony.

97. A method as defined in claim 89 wherein said first compound is Si-Ge.

98. A method as defined in claim 89 wherein said first compound is PbTe.

99. A method as defined in claim 89 wherein said second compound is a telluride or antimonide of Group IB or IIIB transition metals.

100. A method as defined in claim 99 wherein said second compound is a binary or ternary telluride or antimonide of silver, gold, thallium, or indium.

101. A method as defined in claim 100 wherein said second compound is selected from the group consisting of AgTe, $Ag_2Te$, InSb, AgSb, AuTe, $Au_2Te$, AuSb, $Tl_2Te$, TlTe, TlSb, TlSbTe, and $Ag_{25}Sb_{25}Te_{50}$.

102. A method as defined in claim 89 wherein said at least one highly conductive phase comprises $Ag_2Te$.

103. A method as defined in claim 89 wherein said melt is cooled by drawing said melt through a temperature gradient.

104. A method of making a material for thermoelectric applications having low thermal conductivity and high electrical conductivity, said method comprising:
  forming a particulate solid mixture of 99 percent of a first multiple element compound and 1 percent of a second multiple element compound, said first compound comprising $Bi_{40}Te_{42-54}Se_{18-6}$ and said second compound comprising $Ag_{25}Sb_{25}Te_{50}$;
  heating said mixture to an elevated temperature; and thereafter
  cooling said mixture to form said material in solid form.

105. A method as defined in claim 104 wherein said mixture is cooled by the step of drawing said mixture through a temperature gradient.

106. A method as defined in claim 105 wherein said mixture is drawn at a rate of about 10 mm/hr through a temperature gradient of 30° C./cm.

107. A method as defined in claim 104 wherein said mixture is heated to a temperature of about 650° C.

108. A method as defined in claim 104 comprising the further step of adding a dopant to said $Bi_{40}Te_{42-54}Se_{18-6}$ prior to forming said mixture.

109. A method as defined in claim 108 wherein said dopant is cadmium chloride or tellurium iodide.

110. A method as defined in claim 109 wherein about 0.2 w/o of said tellurium iodide is added to said $Bi_{40}Te_{42-54}Se_{18-6}$.

111. A material for thermoelectric applications having low thermal conductivity and high electrical conductivity, said material consisting essentially of 10% to 20% bismuth, about 20% to 30% antimony, about 60% tellurium, and silver, said silver being in an amount less than 1%.

112. A material as defined in claim 111 further including a dopant.

113. A material as defined in claim 112 wherein said dopant is tellurium iodide ($TeI_4$).

114. A material as defined in claim 113 wherein said material includes 0.1% to 1% of said tellurium iodide.

115. A material as defined in claim 114 wherein said material includes about 0.2% of said tellurium iodide.

116. A material for thermoelectric applications having low thermal conductivity and high electrical conductivity, said material consisting essentially of about 40% bismuth, about 42% to 54% tellurium, about 18% to 6% selenium, and silver, said silver being in an amount less than 1%.

117. A material as defined in claim 116 further including a dopant wherein said material includes about 0.05% to 0.2% tellurium iodide.

118. A material as defined in claim 117 wherein said material includes about 0.2% tellurium iodide.

119. A material as defined in claim 116 wherein said dopant is cadmium chloride.

* * * * *

UNITED STATES PATENT AND TRADEMARK OFFICE
CERTIFICATE OF CORRECTION

PATENT NO. : 4,447,277

DATED : May 8, 1984

INVENTOR(S) : Tumkur S. Jayadev and On Van Nguyen

It is certified that error appears in the above-identified patent and that said Letters Patent is hereby corrected as shown below:

```
Cover page, inventors name, delete "Nugyen" and insert
--Nguyen--;
Column  5, line  9, after "therein;", delete "and";
Column  5, line 13, delete "." and insert --; and--;
Column  6, line 36, after "flexible", insert --,--;
Column 10, line  3, delete "highet" and insert --highest--;
Column 11, line  5, after "°K", insert --)--;
Column 15, line 24, delete "claim" and insert --claims--;
Column 15, line 26, after "tellurium", insert --,--;
Column 17, line 25, after "claim", delete "51" and insert
--50--;
Column 20, line 35, delete "cohsisting" and insert
--consisting--.
```

Signed and Sealed this

Twenty-seventh Day of November 1984

[SEAL]

Attest:

Attesting Officer

GERALD J. MOSSINGHOFF

Commissioner of Patents and Trademarks